(12) United States Patent
Hagiwara

(10) Patent No.: US 6,767,839 B1
(45) Date of Patent: Jul. 27, 2004

(54) METHOD FOR FORMING MULTI-LAYER WIRING STRUCTURE

(75) Inventor: Yoshio Hagiwara, Tokyo (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/382,182

(22) Filed: Aug. 24, 1999

(30) Foreign Application Priority Data

Aug. 27, 1998 (JP) .......................... 10-241887

(51) Int. Cl.$^7$ .......................... H01L 21/302
(52) U.S. Cl. .................. 438/725; 438/705; 438/687; 134/1.2
(58) Field of Search .................. 134/1.2; 438/725, 438/687, 705, 624, 618, 737, 638, 639, 640, 723, 637; 216/62, 72

(56) References Cited

U.S. PATENT DOCUMENTS

| | | | |
|---|---|---|---|
| 4,634,496 A | 1/1987 | Mase et al. | |
| 4,673,456 A | 6/1987 | Spencer et al. | |
| 5,178,957 A | 1/1993 | Kolpe et al. | |
| 5,252,177 A | 10/1993 | Hong et al. | |
| 5,399,237 A | 3/1995 | Keswick et al. | |
| 5,472,488 A | 12/1995 | Allman | |
| 5,665,643 A | 9/1997 | Shin | |
| 5,665,845 A | 9/1997 | Allman | |
| 5,759,906 A | * 6/1998 | Lou | 438/623 |
| 5,762,697 A | 6/1998 | Sakamoto et al. | |
| 5,858,869 A | * 1/1999 | Chen et al. | 438/597 |
| 5,891,234 A | 4/1999 | Koyanagi et al. | |
| 5,932,487 A | 8/1999 | Lou et al. | |
| 6,016,000 A | * 1/2000 | Moslehi | 252/522 |
| 6,114,250 A | * 9/2000 | Ellingboe | 438/709 |
| 6,184,126 B1 | * 2/2001 | Lee et al. | 438/637 |
| 6,291,334 B1 | * 9/2001 | Somekh | 438/620 |
| 6,387,819 B1 | * 5/2002 | Yu | 438/725 |

FOREIGN PATENT DOCUMENTS

| | | |
|---|---|---|
| EP | 0 443 760 | 8/1991 |
| JP | 8-316228 | 11/1996 |
| JP | 9-64037 | 3/1997 |

* cited by examiner

Primary Examiner—George A. Goudreau
(74) Attorney, Agent, or Firm—Merchant & Gould P.C.

(57) ABSTRACT

A method for suppressing the cutting of bonds between organic radical (for example, $CH_3$-radical) or H-radical and Si atom in SOG film during an ashing process, thereby maintaining a low dielectric constant, after wiring gutters are formed through etching on organic or inorganic SOG film of low dielectric constant using a patterned resist film(s) thereon as a mask, the resist film(s) is removed by treating with the ashing process by use of a plasma ashing apparatus of a sheet-fed down-stream type under an atmospheric pressure of 1.2 Torr, for example, and thereafter barrier metal is formed and Cu is filled into the wiring gutters, so as to form the wiring.

6 Claims, 6 Drawing Sheets

METHOD FOR FORMING MULTI-LAYER WIRING STRUCTURE

BACKGROUND OF THE INVENTION

1. Field of the Invention

The present invention relates to a method for forming a multi-layer wiring structure, and in particular to applying a so-called damascene method therein.

2. Description of Prior Art

A conventional method for forming the multi-layer wiring or circuit board is shown in FIG. 1.

In the conventional method, first of all, an aluminum (Al) layer is formed on a substrate, as shown in FIG. 1(a), and on this is provided a resist mask on which patterns are formed. Then, as shown in FIG. 1(b), the aluminum (Al) layer is etched through reactive ion etching (RIE), so as to form lower layer wiring. Next, as shown in FIG. 1(c), applying SOG (spin on glass: applying a liquid obtained by dissolving a silicon compound into an organic solvent, such as alcohol or the like) thereto (although the SOG layer is provided directly on the Al wiring in FIG. 1(c), an insulating film may be provided between the Al wiring and the SOG layer by means of a plasma CVD method), and as shown in FIG. 1(d), the SOG layer is flattened with an etch back. Further, as shown in FIG. 1(e), the SOG is applied on a surface which is flat, and so-called via-holes are formed by etching the SOG layer selectively, as shown in FIG. 1(f). Then, Al is filled into the via-holes, as shown in FIG. 1(g). As shown in FIG. 1(g), an Al film is formed. Furthermore, as shown in FIG. 1(h), the Al film is etched so as to form upper wiring, in the same manner as mentioned above, and the SOG is applied on it to fill up spaces defined among the upper wiring, thereby forming the multi-layer wiring structure.

In actual multi-layer wiring structures, many of them are formed with more than 5 layers by applying the etching technology as mentioned above.

Requirements for high integration of semiconductor devices is increasing more and more, and we are just now entering into a generation of 0.15 μm in gate length. In this instance, it is already apparent that the characteristics of semiconductor devices can be improved if applying Cu in place of Al, which is conventionally applied, in particular in the following aspects.

Compared with Al, Cu is superior in durability or tolerance against EM (electromigration), and because of a low resistance thereof, it is possible to reduce the delay of signals due to the resistance of the wiring. Also, it is possible to apply a high current density thereto, i.e., it can increase current density allowable to three-times as high as is immediately realized, thereby enabling the minimization of the width of wiring.

However, because it is difficult to control etching rates, in particular on Cu (compared with Al), a copper damascene method receives much attention as a method for realizing the multl-layer wiring of Cu without the etching on Cu.

The explanation of the conventional copper damascene method will refer to FIG. 2.

First of all, as shown in FIG. 2(a), an insulating film made of either $SiO_2$ or SOG is formed on a substrate using a CVD method for insulation between layers, and on it is provided a resist mask on which predetermined patterns are formed, so as to form wiring gutters by means of an etching method, as shown in FIG. 2(b). Next, as shown in FIG. 2(c), barrier metal is piled up or accumulated, and then Cu is filled up into the wiring gutters through electroplating or the like so as to form lower layer wiring. as shown in FIG. 2(d). And after polishing the barrier metal and Cu by CMP (chemical polishing), the insulating film for maintaining insulation between layers is formed again on the wiring structure, as shown in FIG. 2(e). In the same manner, hereinafter, by etching the insulating films for insulation between layers, selectively, through the resist mask on which the patterns are formed, via-holes and gutters for upper layer wiring are formed on the insulating films between layers (dual damascene), as shown in FIG. 2(f), and the barrier metal is piled up on those via-holes and gutters for upper layer wiring, as shown in FIG. 2(g). Then, as shown in FIG. 2(h), Cu is filled up into the via-holes and gutters using electroplating or the like, thereby forming the upper layer wiring.

As is mentioned above, in the case of forming the multi-layer wiring (or multi-layer wiring structure) through the copper damascene method, increasing the aspect ratio (height/width) of via-holes comes to be a mandatory factor in minimization. However, in a case where $SiO_2$ being formed through the CVD is used as the insulating material between the layers, the aspect ratio which can be obtained is 2 at the utmost, which is not satisfactory.

Also, for minimization, a low dielectric constant is necessary for the insulating film between layers; however the dielectric constant of the $SiO_2$ is $\in=4.1$, i.e., it is relatively high.

Application of organic or inorganic SOG having low dielectric constant ($\in=3.5$ or less than that) has been studied. However, even if the multi-layer wiring is formed using the copper damascene method, applying SOG, the dielectric constant of the SOG comes to be higher, after forming it into the multi-layer wiring than that which the SOG has inherently.

Also, in the case where organic SOG is applied as the material of the insulating film between layers, a defect can easily occur, being called by "poisoned via".

SUMMARY OF THE INVENTION

The inventors of the present invention acknowledge that, in the case of organic SOG, Si—$CH_3$ bonding ($CH_3$ is one example) is cut and changes into Si—OH after forming the multi-layer wiring by using the copper damascene method, for example. While in the case of inorganic SOG, Si—H bonding is cut and changes into Si—OH, and the dielectric constant of the SOG is high due to such changes in structure of the insulating film between layers. Accordingly, the present invention is based on such acknowledgments by the inventors.

Namely, in Japanese Patent Laying-Open No. Hei 8-316228 (1996), for example, there is disclosed a technology, wherein the surface of the inorganic SOG film is densified by treating with an ashing process using $O_2$ as the main reactant onto the inorganic SOG film under a pressure being equal to or less than 40 Pa, so as to prevent the cutting of the Si—H bonding during heat processing, or processing with organic solvent (which will be taken in steps thereafter), thereby increasing tolerance or durability against moisture absorption.

Then, the present invention is accomplished upon the basis of an assumption that, in the case where the same process is applied to exfoliation (i.e., ashing) of the resist mask obtained by the copper damascene method, the Si—$CH_3$ bonding will not be cut when the organic SOG is used, and also the Si—H bonding will not be cut when the inorganic SOG is used, thereby enabling the maintenance of the inherent low dielectric constant of SOG.

Namely, according to the present invention, a method of forming a multi-layer wiring structure, comprising the following steps is provided:

etching via-holes or wiring gutters through a resist mask on a silica based insulating film between layers which has a dielectric constant equal to or less than 3.5;

performing an ashing process on said resist mask using oxygen gas plasma under an atmospheric pressure from 0.01 Torr to 30.0 Torr; and filling up said wiling gutters or said via-holes with conductive material.

Further, preferably, silver, gold, aluminum, copper or the like can be listed as the conductive material mentioned above, and more preferably, copper can be listed. The pressure preferably is within a range from 0.01 Torr to 1.2 Torr. Also, as the method for forming the multi-layer wiring structure a damascene method is preferable, wherein the wiring gutters or the via-holes are filled up with the conductive material after forming barrier metal on the interior surface of the wiring gutters or the via-holes.

The silica based insulating film between layers must have a dielectric constant being equal to or less than 3.5. An organic SOG and inorganic SOG can be listed as a coating liquid for forming such a film. As such the organic SOG, it is appropriate to have a content of carbon lying from 5% by weight to 25% by atomic weight, for example, and more preferably, the content of carbon is from 8% by weight to 20% by atomic weight.

Here, the content of carbon is a scale for indicating a ratio of the organic group within the organic SOG, and in more detail it is theoretically calculated from reacting an amount of alkoxysilane for preparing the coating liquid for forming the organic SOG, i.e., the ratio of the content of carbon with respect to total atomic amount of all elements thereof.

When the content of carbon is less than the range mentioned above, the organic component is too small to form a thick film, thereby cracks occur easily therein. The advantage of having a low dielectric constant, which the organic SOG inherently has is also lost. On the other hand, when the content of carbon is too much, undesirably, shortage occurs in adhesion or bonding of the organic SOG with the barrier metal layer.

For obtaining the film having the content of carbon mentioned above, it is preferable to apply a coating liquid including a chemical compound, being obtained through hydrolysis and condensation reaction of at least one kind of alkoxysilane compounds in organic solvent and in the presence of an acid catalyst. Said one kind of alkoxysilane compounds to be selected from alkoxysilane compounds expressed by a following general equation (I):

$$R_nSi(OR^1)_{4-n} \tag{I}$$

wherein, R in the general equation (I) indicates an alkyl radical having carbon number from 1 to 4 or an aryl radical, $R^1$ an alkyl radical having carbon number from 1 to 4, and n an integer from 1 to 2.

As examples of such chemical compounds expressed by the above general equation (I) are listed as below:

(a) when n=1, the compound is a monoalkyl-trialkoxysilane, such as, monomethyl-trimethoxysilane, monomethyl-triethoxysilane, monomethyl-tripropoxysilane, monoethyl-trimethoxysilane, monoethyl-triethoxysilane, monoethyl-tripropoxysilane, monopropyl-trimethoxysilane or monopropyl-trimethoxysilane, or a monophenyl-trialkoxysilane, such as, monophenyl-trimethoxysilane or monophenyl-triethoxysilane.

(b) when n=2, the compound is a dialkyl-dialkoxysilane, such as, dimethyl-dimethoxysilane, dimethyl-diethoxysilane, dimethyl-dipropoxysilane, diethyl-dimethoxysilane, diethyl-diethoxysilane, diethyl-dipropoxysilane, dipropyl-dimethoxysilane, dipropyl-diethoxysilane or dipropyl-dipropoxysilane, or a diphenyl-dialkoxysilane, such as diphenyl-dimethoxysilane or diphenyl-diethoxysilane. It is necessary to use at least one kind of compound listed in (a) and (b) above.

As other components which can be co-condensated, if desired, with the compounds in (a) and (b), when n=0 in the chemical components expressed by the above general equation (I), (c) tetralkoxysilane, such as, tetraethoxysilane, tetraethoxysilane, tetrapropoxysilane or tetrabutoxysilanecan be effectively used.

Among the compounds listed in (a), (b), and (c) above, the chemical compounds being preferably used from a practical view point are tetramethoxysilane, tetraethoxysilane, monomethyl-trimethoxysilane, monomethyl-triethoxysilane, dimethyl-dimethoxysilane, and dimethyl-diethoxysilane.

Those alkoxysilane compounds may be used only one kind at a time thereof or by two or more kinds combined together.

In more detail, when only one kind is used, (a) is preferable. When combining two kinds, (a) and (b) are preferable, and when combining three kinds, (a), (b) and (c), are preferable. With regard to the reaction mol ratio, in such instances, in particular when combining the two kinds, the (a) and (b), the coating liquid including hydrolysis co-condensate, can be obtained by reacting the (a) monoalkyl-trialkoxylsilane from 2 mol to 6 mol, more preferably from 2 mol to 4 mol, on 1 mol of the (c) tetraalkoxysilane in organic solvent under the presence of acid catalyst, is preferable since it shows superior adhesion on a coated layer.

Also, when combining three kinds, the (a), (b) and.(c), the coating liquid including hydrolysis co-condensate, being obtained by reacting the (c) tetraalkoxysilane from 0.5 mol to 4 mol, more preferably from 1.0 mol to 3.0 mol, and the (a) monoalkyl-trialkoxysilane from 0.5 mol to 4 mol, more preferably from 0.5 mol to 3.0 mol, on 1 mol of the (b) dialkyldialkoxysilane in organic solvent under the presence of acid catalyst, is preferable since it shows superior adhesion on a coated layer.

Further, when only using the (a) monoalkyl-trialkoxysilane, hydrolysis co-condensate of a ladder type can be obtained easily, and is preferable since this ladder type forms the film which has the lowest dielectric constant among the organic and inorganic SOGs.

Hydrolysate may be complete hydrolysate or partial hydrolysate. The degree of hydrolysis can be adjusted by the amount of water added. The amount of water may be adjusted appropriately depending upon the characteristics of the organic SOG film to be obtained, however, in general, it is preferable to react water from 1.0 to 10.0 times the mol ratio thereof, more preferably from 1.5 to 8.0, on 1 mol of total amount of alkoxysilane compound, which can be expressed by the above general equation. When being too much less than indicated above, the degree of hydrolysis is decreased and it is difficult to form the film therewith, thereby being undesirable. Also, when the amount of water used is too much than indicated above, it is also undesirable, since it allows gelification to occur easily, thereby deteriorating stability for preservation thereof.

Also, as the acid catalyst either organic acid or inorganic acid can be used, both of which are conventionally used in the prior arts. As such the organic acids which can be listed are organic carboxylic acid, such as, acetic acid, propionic acid, butylic acid, or the like. As such the inorganic acids which can be listed are, for example, hydrochloric acid, nitric acid, sulfuric acid, phosphoric acid, or the like.

In this instance, the acid catalyst or acid-water solution of mixing acid and water is added so that acid resides within the coating liquid from 1 ppm to 1,000 ppm, more preferably from 5 ppm to 500 ppm in concentration thereof, thereby hydrolysis occurs.

The hydrolysis, in general, completes the reaction thereof in a time period from 5 to 100 hours. Also, under the heating condition from room temperature to 80° C., the reaction can be completed within a short reacting time period by adding dropwise the water solution of acid catalyst including alkoxysilane composition to react thereon. The alkoxysilane composition hydrolyzed in this manner causes a condensation reaction, and as the result, it forms the films.

As the organic solvents which can be used are those which are conventionally used in the prior arts, including monatomic alcohol, such as, methyl alcohol, ethyl alcohol, propyl alcohol, or butyl alcohol, polyatomic alcohol, such as, ethylene glycol, diethylene glycol or propylene glycol, derivatives of polyatomic alcohol, such as, ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate or propylene glycol monomethyl ether acetate, and fatty acid, such as acetic acid, propionic acid, etc. Each of those organic solvents can be used alone, or in combinations of two kinds or more therefrom. As for the amount of it/them to be used, a ratio being from 10 to 30 times in the mol ratio thereof with respect to 1 mol of alkoxysilane is used.

On the other hand, inorganic SOG is a solution containing, as solvent, alkylane glycol dialkyl ether, which contains the acid hydrolysis condensate of trialkoxysilane therein, and in particular, preferably shows an increase in weight when performing thermogravimetric analysis or measurement after removing the solvent, since it has a low dielectric constant and is superior in durability or tolerance against cracking.

The inorganic SOG is obtained by adjusting the containing amount of the alcohol which is produced by reaction in reacting mixture to be equal or less than 15% by weight, after dissolving trialkoxysilane described in Japanese Patent Laid-Open No. Hei 9-137121 (1997) into alkylene glycol dialkyl ether at a concentration from 1% by weight to 5% by weight being exchanged for $SiO_2$, into which solution is added water from 2.5 mol to 3.0 mol per 1 mol of trialkoxylsilane so as to cause hydrolysis condensation under the existence of acid catalyst.

In the above-mentioned, the reason for selecting the concentration of trialkoxysilane being exchanged for $SiO_2$ to be from 1% by weight to 5% by weight is that, with this the insulating film between layers of the ladder structure can be obtained. This ladder structure is preferable since a dense film can be formed therewith and the dielectric constant obtained thereof is low.

As such, examples of the above mentioned trialkoxysilane, can include: trimethoxysilane, triethoxysilane, tripropoxysilane, tributoxysilane, diethoxy-monomethoxysilane, monomethoxy-dipropoxysilane, dibutoxy-monomethoxysilane, ethoxy-methoxy-propoxysilane, monoethoxy-dimethoxysilane, monoethoxy-dipropoxysilane, butoxy-ethoxy-propoxysilane, dimethoxy-monopropoxysilane, diethoxy-monopropoxysilane, monobutoxy-dimethoxysilane, etc. Among those, the chemical compounds being preferable from a practical view point are trimethoxysilane, triethoxysilane, tripropoxysilane, tributoxysilane, and among those being selected, in particular trimethoxysilane and triethoxysilane are more preferable.

Next, as the solvent, it is necessary to use alkylene glycol dialkyl ether for increasing the stability for preservation thereof. By using this solvent, it is possible to suppress the resolving reaction of H—Si radical in trialkoxysilane, which occurs in the conventional method of using less alcohol as solvent, or to suppress the displacement reaction of the alkoxy radical by ahydroxyl radical (which is produced as an intermediate) in silanol, thereby prohibiting gelification thereof.

As this alkylene glycol dialkyl ether, dialkyl ether of alkylene glycol or the like can be listed, for example, ethylene glycol dimethyl ether, ethylene glycol diethyl ether, ethylene glycol dipropyl ether, ethylene glycol dibutyl ether, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, and propylene glycol dibutyl ether. Among those, dialkyl ether of ethylene glycol or propylene glycol is preferable, in particular of ethylene glycol dimethyl ether or propylene glycol dimethyl ether. Each of those organic solvents can be used alone, or two kinds or more therefrom can be combined. The ratio of it/them to be used is from 10 to 30 times the mol ratio thereof with respect to 1 mol of alkoxysilane.

Water for causing hydrolysis of trialkoxysilane is preferably used within a range from 2.5 mol to 3.0 mol with respect to 1 mol of trialkoxysilane, and more preferably from 2.8 mol to 3.0 mol, for increasing the degree of hydrolysis. When the ratio of water is too lowcompared with this range, though, the stability for preservation can be increased, however the degree of hydrolysis is decreased and the amount of organic radicals therein comes to be large, thereby generating gas when forming the films. On the other hand, if the ratio of water is too high, the stability for preservation is deteriorated.

Even if at least one kind selected from alkylene glycol dialkyl ether is used without using alcohol as the solvent, since alcohol corresponding to an alkoxy radical is inevitably produced in the hydrolysis of alkoxysilane, it is necessary to remove from the reaction system the alcohol which is produced. In more detail, it is necessary to remove the alcohol to the point that it is equal or less than 15% by weight within the coating liquid, more preferably until it is equal to or less than 8% by weight. If the alcohol remaining is in excess of 15% by weight, the alcohol produced reacts with H—Si radical to produce RO-Si radical, thereby decreasing the limit of cracks, as well as generating gases when forming the films, i.e., causing the troubles mentioned above.

As a means for removing the alcohol, distillation under reduced pressure is preferable, in particular, for a time period from 2 to 6 hours in a vacuum from 30 mmHg to 300 mmHg, more preferably from 50 mmHg to 200 mmHg, and in the temperature from 20° C. to 50° C. The coating liquid obtained in this manner can be. characterized by the aspects that the film forming component, after removing the solvent, shows an increase in weight when measuring it with thermogravimetric analysis (TG), and that it does not have a peak at 3,000 cm$^{-1}$ in the infrared light absorption spectrum thereof. Contrarily, the conventional coating liquid, such as described in Japanese Patent Laid-Open No. Hei 4-216827 (1992), shows a decrease in the weight thereof when measuring it with thermogravimetric analysis, and has a peak in the vicinity of 3,000 cm$^{-1}$ in the infrared light absorption spectrum, thereby indicating that alkoxy radical remains therein.

Also, with a method for forming the silica based insulating film between layers, for example, the coating liquid is applied or coated on a surface of a substrate, such as, semiconductor substrate a glass substrate, a metal substrate, a ceramic substrate or the like, by means of, such as, a spinner method, a toll coating method, a dip and pull up method, a spray method, a screen printing method, a brush painting method, and so on, and is is dried by evaporation of the solvent so as to form the coated film therewith. Then, the insulating film is formed by baking it in a temperature from 250° C. to 500° C.

DETAILED DESCRIPTION OF PREFERRED EMBODIMENT(S)

Figure 1:
FIGS. 1(a) through (i) show general steps for forming a multi-layer wiring structure.
Figure 1:
Figure 1:
Figure 1:
Figure 1:
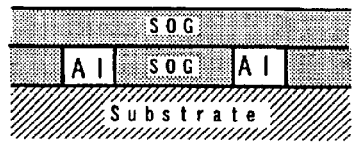
Figure 1:
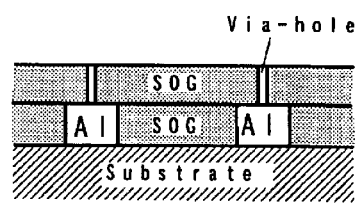
Figure 1:
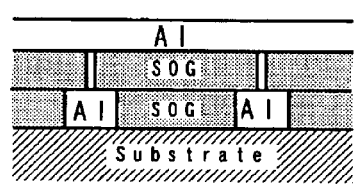
Figure 1:
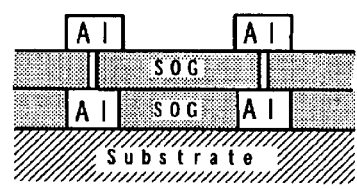
Figure 1:
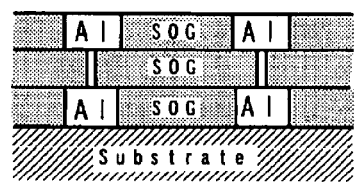
Figure 2:
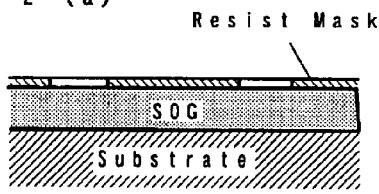
FIGS. 2(a) through (h) show steps for forming a multi-layer wiring structure, according to the copper damascene method of the present invention.
Figure 2:
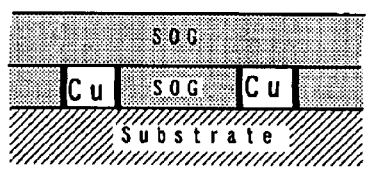
Figure 2:
Figure 2:
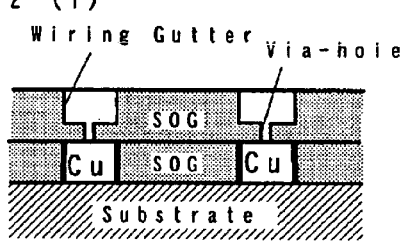
Figure 2:
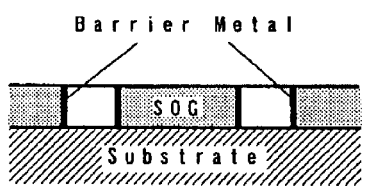
Figure 2:
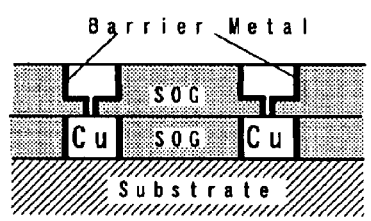
Figure 2:
Figure 2:
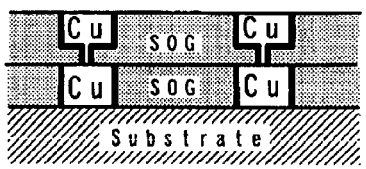

Hereinafter, embodiments according to the present invention will be fully explained by referring to the attached drawings.

Embodiment No. 1
Preparation of Coating Liquid 246 g of tetramethoxysilane (1.62 mol) and 440 g of monomethyl-trimethoxysilane (3.24 mol) are dissolved into 332 g of polyprene glycol monopropyl ether (2.81 mol) and mixed and stirred therein. Next, after adding dropwise 277 g of pure water (15.39 mol) in which nitric acid is mixed at 24 ppm, while stirring slowly, this is further stirred for about five (5) hours, and thereafter they are left still at room temperature for five (5) days, thereby obtaining a mixture with 15% by weight in solid component thereof.

After applying the solution mentioned above as the coating liquid on a substrate, it is baked at 400° C. so as to form organic SOG film thereon. The amount of carbon contained within the organic SWG film is determined as 12.4% by atomic weight from the following equation. Also, the organic SOG film measured has a dielectric constant of 3.5 thereof.

$$2C/[2(CH_3SiO_{3/2})+SiO_2] \times 100$$

Next, wiring gutters are formed by performing the etching upon the organic SOG film using a patterned resist film as a mask thereon, and thereafter, the resist film is removed by applying the ashing process with oxygen gas plasma using a plasma ashing apparatus of a sheet-fed down-stream type, under an atmospheric pressure of 1.2 Torr. Then, barrier metal is formed in the wiring gutters, and thereafter, Cu is filled into them by means of an electroplating method to form lower layer wiring.

Figure 3:
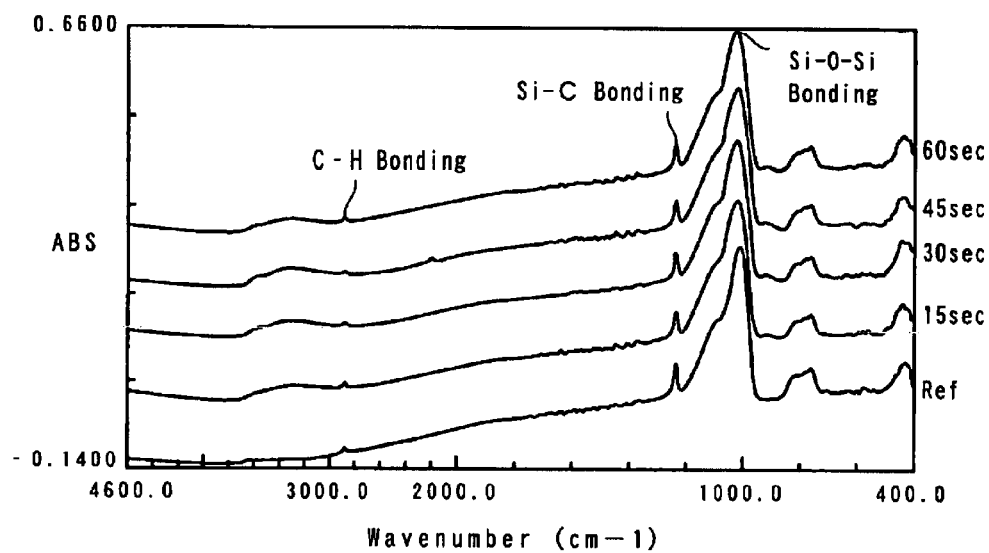
FIGS. 3(a) and (b) show a graph of the infrared light absorption spectrum when treating with an ashing process for a predetermined time under an atmospheric pressure of 1.2 Torr using a plasma ashing apparatus of a sheet-fed down-stream type, and a graph of the infrared light absorption spectrum when treating with said ashing process for 30 seconds under a predetermined pressure using the same plasma ashing apparatus, respectively.
Figure 3:
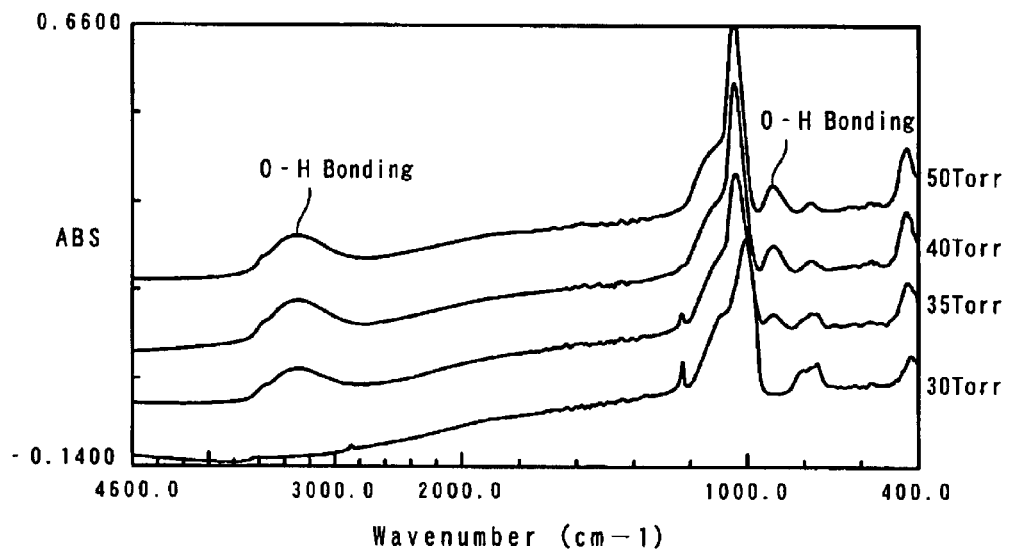

FIG. 3(a) shows curves indicating infrared light absorption spectra obtained by differing the times of ashing processes, namely, 60 seconds, 45 seconds, 30 seconds, 15 seconds, and unattended, respectively, in order from the upper curve. From this graph, it is apparent that the Si—C bonding is not cut in the case when using the present invention.

On the other hand, in FIG. 3(b), the condition is the same until when the wiring gutters are formed by performing the etching, however the ashing process time thereafter, (i.e., the time during when the ashing process is performed with use of the same plasma ashing apparatus) is 30 seconds, and the curves indicate infrared light absorption spectra obtained by differing the pressures used in the ashing process, for example, 50 Torr, 40 Torr, 35 Torr, and 30 Torr, respectively, in order from the upper curve. From this graph, it is apparent that the Si—C bonding is cut and OH bonding occurs when the pressure applied in the ashing process is increased.

Embodiment No. 2
Preparation of Coating Liquid 304.4 g of tetramethoxysilane (2 mol), 272.4 g of monomethyl-trimethoxysilane (2 mol) and 120.2 g of dimethyl-dimethoxysilane (1 mol) are dissolved into 608.6 g of isopropyl alcohol (8.21 mol) and mixed therein. Next, after adding dropwise 288.0 g of pure water (16 mol) containing nitric acid at 40 ppm, while stirring slowly, it is further stirred for about five (5) hours, and thereafter they are left still at room temperature for five (5) days, thereby obtaining a mixture with 16% by weight in solid component thereof.

After applying the solution mentioned above as the coating liquid on the lower wiring of (the embodiment No. 1), it is baked at 400° C. so as to form organic SOG film thereon. The amount of carbon contained within the organic SOG film is 14.6% by atomic weight, derived from the following equation. Also, the organic SOG film measured has a dielectric constant of 3.0.

$$4C/[(CH_3)_2SiO_{2/2}+2(CH_3SiO_{3/2})+2SiO_2] \times 100$$

Next, via-holes and upper layer wiring gutters are formed by performing a dual damascene method on the organic SOG film, using a patterned resist film as a mask thereon, and thereafter, the resist film is removed by applying the ashing process with oxygen gas plasma using the plasma ashing apparatus of a sheet-fed down-stream type, under an atmospheric pressure of 1.0 Torr. Then, barrier metal is formed in the via-holes and the upper layer wiring gutters, and thereafter, Cu is filled into both by means of an electroplating method to form the upper layer wiring and its connection to the lower layer wiring.

Figure 4:
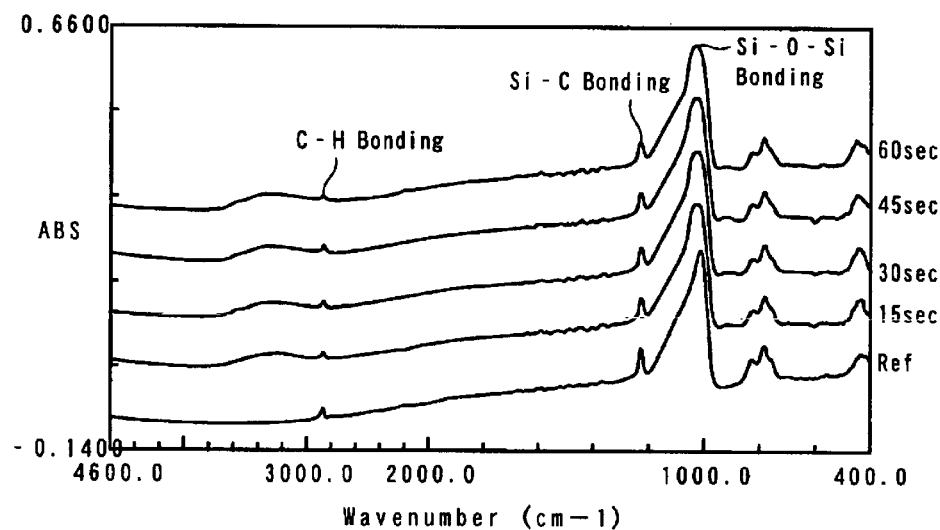
FIGS. 4(a) and (b) show a graph of infrared light absorption spectrum when treating ashing process for a predetermined time under an atmospheric pressure of 1.0 Torr with using the plasma ashing apparatus of the sheet-fed down-stream type and a graph of infrared light absorption spectrum when treating ashing process for 30 seconds under a predetermined pressure with using the same plasma ashing apparatus, respectively.
Figure 4:
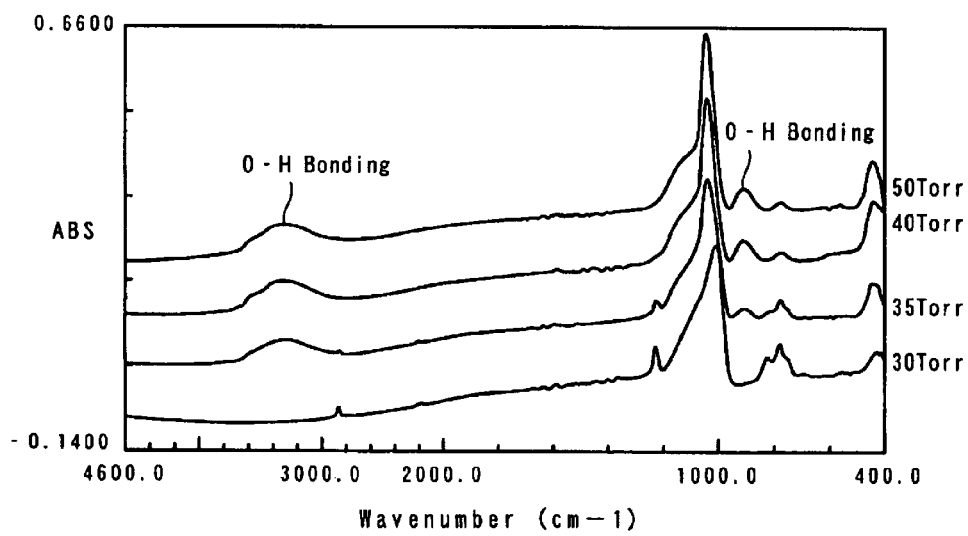

FIG. 4(a) shows curves indicating infrared light absorption spectra obtained by differing the times of ashing processes, namely, 60 seconds, 45 seconds, 30 seconds, 15 seconds, and unattended, respectively, in order from the upper curve. From this graph, it is apparent that the Si—C bonding is not cut in the case when using to the present invention.

On the other hand, in FIG. 4(b), the condition is same until when the via-holes and the upper layer wiring gutters are formed by performing the etching, however the ashing process time thereafter, i.e., the time during when the ashing process is performed with use of the same plasma ashing apparatus, is 30 seconds, and the curves indicate infrared light absorption spectra obtained by differing the ashing process pressures, namely , 50 Torr, 40 Torr, 35 Torr, and 30 Torr, respectively, in order from the upper curve. From this graph, it is apparent that the Si—C bonding is cut and OH bonding occurs when the pressure applied in the ashing process is increased.

Embodiment No. 3
Preparation of Coating Liquid

Hydrolysis condensate of ladder type, which is obtained by hydrolysis and condensation of monomethyl triethoxysilane in the presence of acid catalyst is dissolved into ethanol, and a mixture obtained at 10% by weight in solid concentration is applied as the coating liquid.

After applying this coating liquid on the lower wiring of (the embodiment No. 1), it is baked at 400° C. so as to form organic SOG film thereon. An amount of carbon contained in the organic SOG film formed with this coating liquid is 17.9% by atomic weight, as determined from the following equation. Also, the organic SOG film measured has a dielectric constant of 2.8 thereof.

$$C/[(CH_3)SiO_{3/2}] \times 100$$

Next, via-holes and upper layer wiring gutters are formed by performing a dual damascene method on the organic SOG film, using a patterned resist film as a mask thereon, and thereafter, the resist film is removed by applying the ashing process with oxygen gas plasma using a plasma ashing apparatus of a sheet-fed down-stream type, under an atmospheric pressure of 0.8 Torr. Then, barrier metal is formed in the via-holes and the upper layer wiring gutters, and thereafter, Cu is buried into both by means of the electroplating method to form the upper layer wiring and its connection to the lower layer wiring.

Figure 5:
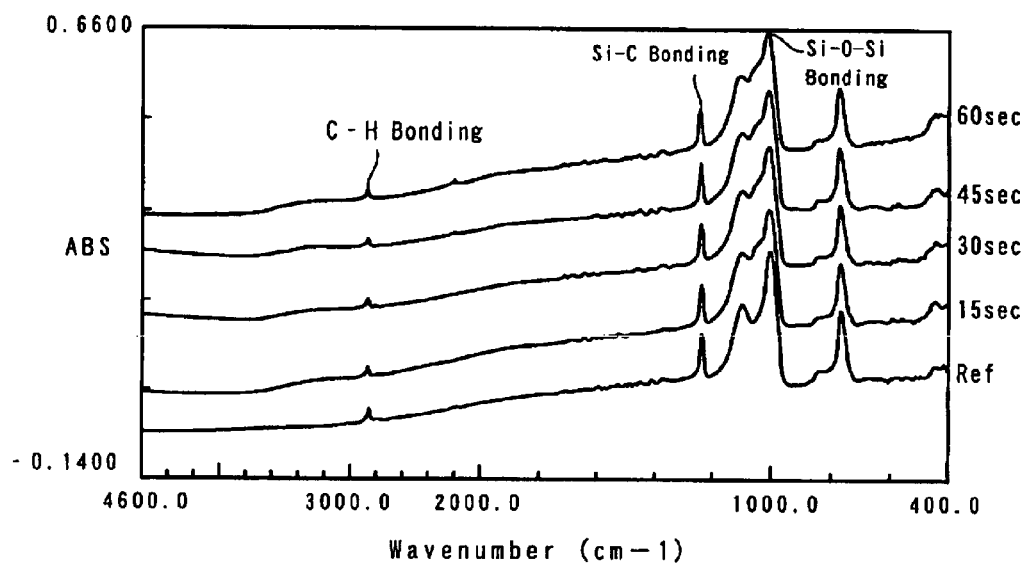
FIGS. 5(a) and (b) show a graph of the infrared light absorption spectrum when treating with an ashing process for a predetermined time under an atmospheric pressure of 0.8 Torr using the plasma ashing apparatus of the sheet-fed down-stream type, and a graph of the infrared light absorption spectrum when treating with said ashing process for 30 seconds under a predetermined pressure using the same plasma ashing apparatus, respectively.
Figure 5:
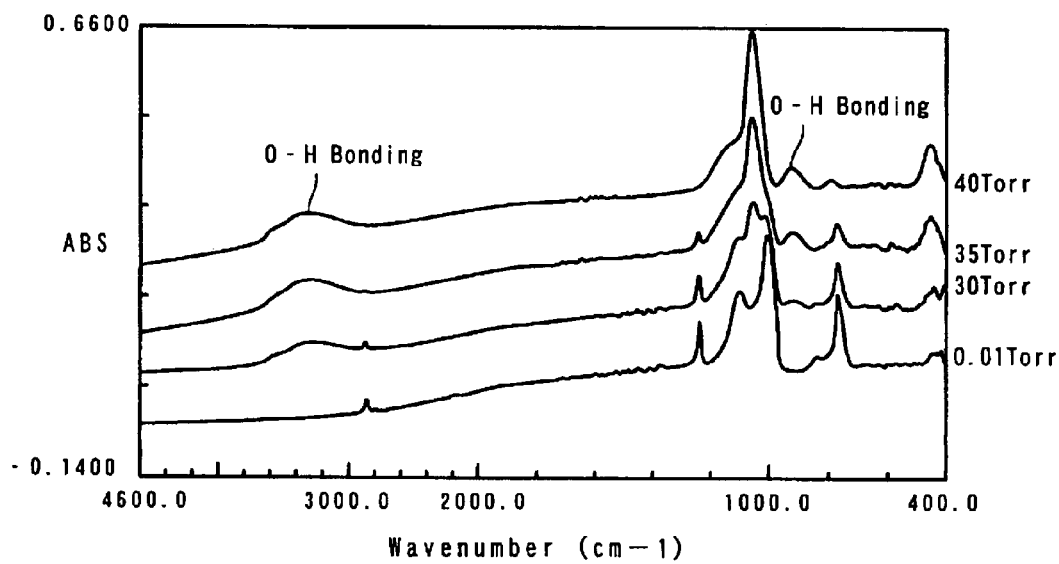

FIG. 5(a) shows curves indicating infrared light absorption spectra obtained by differing the times of the ashing processes, namely, 60 seconds, 45 seconds, 30 seconds, 15 seconds, and unattended, respectively, in order from the upper curve. From this graph, it Is apparent that the Si—C bonding is not cut in the case when using the present invention.

On the other hand, in FIG. 5(b), the condition is the same until when the via-holes and the upper layer wiring gutters are formed by performing the etching, however the ashing process time thereafter, i.e., the time during when the ashing process is performed with use of the same plasma ashing apparatus, is 20 seconds, and the curves indicate infrared light absorption spectra obtained by differing the ashing process pressures, for example, 40 Torr, 35 Torr, 30 Torr, and 0.01 Torr, respectively. From this graph, it is apparent that the Si—C bonding is cut and OH bonding occurs when the pressure applied in the ashing process is increased.

Embodiment No. 4
Preparation of Coating Liquid 73.9 g (0.45 mol) of triethoxysilane, being 3% by weight exchanged for $SiO_2$, is dissolved into 799.0 g (8.87 mol) of ethylene glycol dimethyl ether and they are stirred. Next, after adding dropwise 24.2 g of pure water (1.34 mol) in which concentrated nitric acid is mixed at 5 ppm, while stirring slowly, it is further stirred for about five (5) hours, and thereafter left still at room temperature for five (5) days, thereby obtaining a solution.

The coating liquid of 8% by weight in solid concentration and of 3% by weightin ethanol concentration is prepared by distilling said solution under reduced pressure from 120 to 140 mmHg for 1 hour at 40° C.

After being applied on substrate, the coating liquid is baked at 400° C. so as to form the inorganic SOG film. This inorganic SOG film is measured as having a dielectric constant of 3.0. On this inorganic SOG film are formed wiring gutters by etching through the patterned resist films (as the mask), and thereafter, the resist film is removed by applying the ashing process with oxygen gas plasma using the plasma ashing apparatus of the sheet-fed down-stream type, under an atmospheric pressure of 0.5 Torr. Then, barrier metal is formed in the wiring gutters, and thereafter, Cu is filled into them by means of the electroplating method to form the lower layer wiring.

Figure 6:
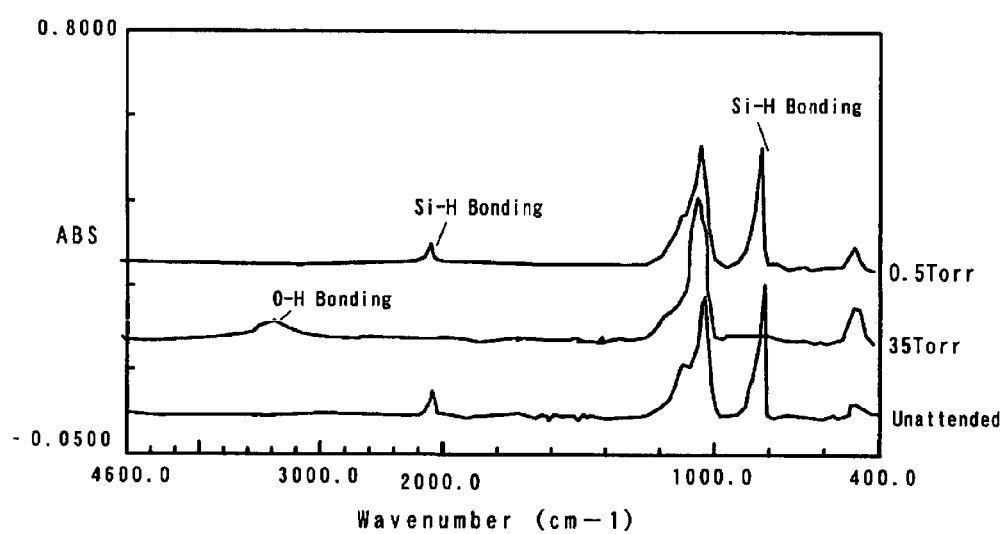
FIG. 6 shows a graph of the infrared light absorption spectrum when treating with an ashing process for 30 seconds under a predetermined pressure using the plasma ashing apparatus of the sheet-fed down-stream type.

Those shown in the upper stage and the lower stage in FIG. 6 are the infrared light absorption spectra when differing the time period of the ashing process mentioned above, namely, 120 seconds and unattended (0 second). From this figure, it is apparent that the Si—H bonding is not cut in the case when using the present invention.

On the other hand, that shown in the middle stage of FIG. 6 is the infrared light absorption spectrum, being obtained, though under the same condition mentioned above until the wiring gutters are formed by the etching, when the ashing process is performed using the same plasma ashing apparatus for 120 seconds, but the pressure is changed to 35 Torr. From this figure, it is apparent that the Si—H bonding is cut and OH-bonding occurs when the pressure is increased during the ashing process.

As is fully described in the above, according to the present invention, in the method for forming a multi-layer circuit board, by etching via-holes or wiring gutters through a resist mask on a silica based insulating film between layers having a dielectric constant being equal to or less than 3.5, and filling up said wiring gutters or said via-holes with conductive material by using the damascene method, wherein the ashing process is performed on said resist mask with oxygen gas plasma under an atmospheric pressure from 0.01 Torr to 30.0 Torr (more preferably, from 0.01 Torr to 1.2 Torr), the bonding is hardly cut between Si and organic radical or between Si and hydrogen radical, constituting the insulating film between layers of silica, thereby maintaining a low in the dielectric constant thereof.

Also, in particular when organic SOG is applied, since the bonding is hardly cut between Si and organic radical, the generation of poisoned via is suppressed therein.

What is claimed is:

1. A method for forming a multi-layer wiring structure, comprising the following steps:

etching via-holes or wiring gutter through a resist mask on a silica based interlayer insulator having dielectric constant being equal to or less than 3.5 said silica based interlayer insulator containing carbon from 5% by atomic weight to 25% by atomic weight;

performing an ashing process on said resist mask using oxygen gas plasma under an atmospheric pressure from 0.01 Torr to 30.0 Torr; and filling up said wiring gutters or said via-holes with conductive material using a damascene method.

2. A method for forming a multi-layer wiring structure, as described in claim 1, wherein said silica based interlayer insulator is formed by coating and baking a coating liquid including a chemical compound, being obtained through hydrolysis and condensation reaction of at least one kind of alkoxysilane compounds in organic solvent under presence of an acid catalyst, wherein said one kind of alkoxysilane compounds is selected from alkoxysilane compounds expressed by the following general equation(I):

$$R_n Si(OR^1)_{4-n} \qquad (I)$$

wherein, R in the general equation (I) indicates an alkyl group having carbon number from 1 to 4 or an aryl group, $R^1$ indicates an alkyl group having carbon number from 1 to 4, and n indicates an integer from 1 to 2.

3. A method for forming a multi-layer wiring structure, as described in claim 2, wherein said coating liquid contains hydrolysis co-condensate being obtained by reacting monoalkyl-trialkoxysilane from 2 mol to 6 mols with 1 mol of tetraalkoxysilane in the organic solvent in the presence of the acid catalyst.

4. A method for forming a multi-layer wiring structure, as described in claim 2, wherein said coating liquid contains hydrolysis co-condensate being obtained by reacting tetraalkoxysilane from 0.5 mol to 4 mols and monoalkyl-trialkoxysilane from 0.5 mol to 4 mols with 1 mol of dialkyl-dialkoxysilane in the organic solvent in the presence of the acid catalyst.

5. A method for forming a multi-layer wiring structure, as described in claim 2, wherein said coating liquid contains hydrolysis condensate of a ladder type obtained from monoalkyl-trialkoxysilane.

6. A method for forming a multi-layer circuit board, as described in claim 1, wherein said silica based interlayer insulator is formed by coating with a coating liquid, and baking said coating liquid, which is obtained from a solution of a solvent of alkyleneglycol-dialkyl ether containing acid hydrolysis condensation product of trialkoxysilane, and which shows an increase in weight when performing thermogravimetric measurement on a component forming the film after removing the solvent.

* * * * *